US009029808B2

(12) United States Patent
Gwinn et al.

(10) Patent No.: US 9,029,808 B2

(45) Date of Patent: May 12, 2015

(54) LOW CONTAMINATION SCANNER FOR GCIB SYSTEM

(71) Applicant: TEL Epion Inc., Billerica, MA (US)

(72) Inventors: Matthew C. Gwinn, Winchendon, MA (US); Avrum Freytsis, Salem, MA (US); Jerry Negrotti, Beverly, MA (US); Robert K. Becker, Danvers, MA (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 14/444,791

(22) Filed: Jul. 28, 2014

(65) Prior Publication Data

US 2014/0332696 A1 Nov. 13, 2014

Related U.S. Application Data

(63) Continuation-in-part of application No. 13/411,329, filed on Mar. 2, 2012, now Pat. No. 8,791,430.

(60) Provisional application No. 61/449,467, filed on Mar. 4, 2011.

(51) Int. Cl.

*H01J 37/20* (2006.01)
*G21K 5/08* (2006.01)
*H01J 37/317* (2006.01)

(52) U.S. Cl.

CPC . *H01J 37/20* (2013.01); *G21K 5/08* (2013.01); *H01J 37/317* (2013.01); *H01J 2237/20228* (2013.01); *H01J 2237/20235* (2013.01); *H01J 2237/20278* (2013.01)

(58) Field of Classification Search

USPC ........................................................ 250/491.1

See application file for complete search history.

(56) References Cited

U.S. PATENT DOCUMENTS 4,494,005 A 1/1985 Shibata et al.
4,733,091 A 3/1988 Robinson et al.
4,965,862 A 10/1990 Freytsis et al.
4,980,562 A 12/1990 Berrian et al.
5,003,183 A 3/1991 Nogami et al.
5,789,890 A 8/1998 Genov et al.
5,814,194 A 9/1998 Deguchi et al.
6,158,908 A * 12/2000 Yuge ............................ 400/320
6,241,462 B1 6/2001 Wannasuphoprasit et al.
6,486,478 B1 11/2002 Libby et al.
6,494,666 B2 12/2002 Wu et al.
6,566,661 B1 5/2003 Mitchell
6,580,083 B2 6/2003 Berrian
6,646,277 B2 11/2003 Mack et al.
6,953,942 B1 10/2005 Graf et al.

(Continued)

*Primary Examiner* — Phillip A Johnston

(74) *Attorney, Agent, or Firm* — Wood, Herron & Evans, LLP

(57) ABSTRACT

Disclosed are an apparatus, system, and method for scanning a substrate or other workpiece through a gas-cluster ion beam (GCIB), or any other type of ion beam. The workpiece scanning apparatus is configured to receive and hold a substrate for irradiation by the GCIB and to scan it through the GCIB in two directions using two movements: a reciprocating fast-scan movement, and a slow-scan movement. The slow-scan movement is actuated using a servo motor and a belt drive system, the belt drive system being configured to reduce the failure rate of the workpiece scanning apparatus. The apparatus further includes shields and other features for reducing process contamination resulting from scattering of the GCIB from the scanning apparatus.

18 Claims, 11 Drawing Sheets

(56) References Cited

U.S. PATENT DOCUMENTS

| | | | | |
|---|---|---|---|---|
| 7,057,192 | B2 | 6/2006 | Kaim et al. | |
| 7,067,828 | B2 | 6/2006 | Swenson | |
| 7,078,714 | B2 | 7/2006 | Maeno et al. | |
| 7,105,838 | B2 | 9/2006 | Naylor-Smith et al. | |
| 7,112,808 | B2 | 9/2006 | Ioannou et al. | |
| 7,119,343 | B2 | 10/2006 | Asdigha et al. | |
| 7,141,809 | B2 | 11/2006 | Vanderpot et al. | |
| 7,267,520 | B2 | 9/2007 | Kellerman et al. | |
| 7,326,941 | B2 | 2/2008 | Chen et al. | |
| 7,564,024 | B2 * | 7/2009 | Hofmeester et al. | 250/251 |
| 7,608,843 | B2 * | 10/2009 | Freytsis et al. | 250/492.2 |
| 7,772,571 | B2 | 8/2010 | Shen et al. | |
| 7,785,060 | B2 | 8/2010 | Relleen et al. | |
| 2002/0134950 | A1 | 9/2002 | Vanderpot et al. | |
| 2003/0094583 | A1 | 5/2003 | Jang et al. | |
| 2003/0155533 | A1 | 8/2003 | Iwasawa et al. | |
| 2003/0197133 | A1 | 10/2003 | Turner et al. | |
| 2004/0222390 | A1 | 11/2004 | Ferrara et al. | |

* cited by examiner 500
560
590
530
520
545
540
550
505
510

500
510
520
580
505
540
545
550
570
560
598
595

2000
545
2020
2010
2030
2015
A
2050
2025
B
2040
2030
2020
A
2015
530
535
540
B

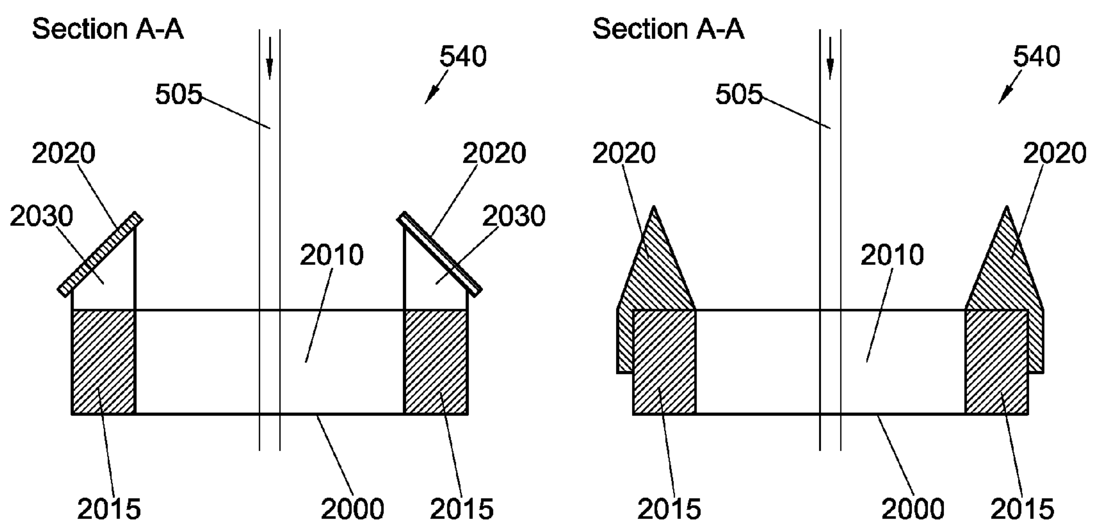
FIG. 10B
FIG. 10C
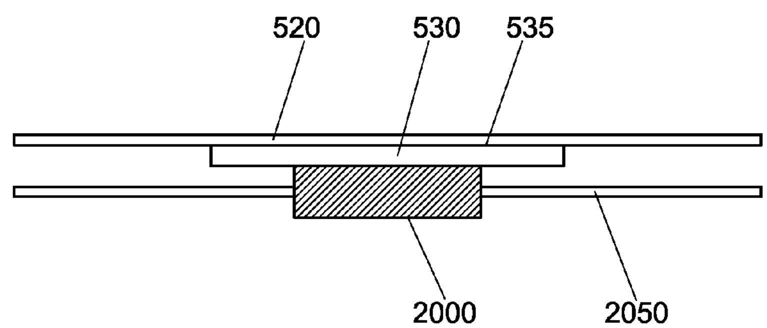
FIG. 10D

LOW CONTAMINATION SCANNER FOR GCIB SYSTEM

CROSS REFERENCE TO RELATED APPLICATIONS

This application is based on and claims the benefit of and priority to U.S. Nonprovisional patent application Ser. No. 13/411,329, entitled "SCANNER FOR GCIB SYSTEM" (Ref. No. EP-174), filed on Mar. 2, 2012, which is a nonprovisional of and claims priority to U.S. Provisional Patent Application No. 61/449,467, entitled "SCANNER FOR GCIB SYSTEM" (Ref. No. EP-174PRO), filed on Mar. 4, 2011, now expired. This application is also related to U.S. patent application Ser. No. 11/565,267, entitled "METHOD AND APPARATUS FOR SCANNING A WORKPIECE THROUGH AN ION BEAM", filed on Nov. 30, 2006, and issued as U.S. Pat. No. 7,608,843 on Oct. 27, 2009. The contents of all of these applications are herein incorporated by reference in their entirety.

BACKGROUND OF THE INVENTION

1. Field of the Invention

This invention relates to a system and method for irradiating substrates using a gas cluster ion beam (GCIB), and more specifically to an improved apparatus, system, and method for scanning of a substrate through the GCIB.

2. Description of Related Art

Gas cluster ion beams (GCIB's) are used for doping, etching, cleaning, smoothing, and growing or depositing layers on a substrate. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Related U.S. patent application Ser. No. 11/565,267, entitled "METHOD AND APPARATUS FOR SCANNING A WORKPIECE THROUGH AN ION BEAM", filed on Nov. 30, 2006, issued as U.S. Pat. No. 7,608,843 on Oct. 27, 2009, and incorporated by reference herein in its entirety, describes a workpiece scanning mechanism for scanning workpieces, such as wafers, substrates, etc., through a gas cluster ion beam (GCIB). The scanner described therein has two movements which in combination allow every point of the workpiece to be reached by the GCIB. The first movement is a fast reciprocating movement of the workpiece through the GCIB (i.e. the fast-scan movement), with the workpiece attached to an arm akin to an inverted pendulum; the resultant path of the GCIB across the workpiece having an arcuate shape. The second movement is a slow linear movement of the center of rotation of the arm (i.e. the slow-scan movement), which causes different parallel arcuate paths to be traced by the GCIB across the workpiece, thereby allowing processing of the entire area of the workpiece. The fast-scan movement motor and center of rotation of the arm holding the workpiece, of the embodiments described therein, is mounted on a shuttle of a vertical shuttle drive assembly, wherein upwards movement thereof is actuated by a slow-scan servo motor pulling the shuttle upwards via a pulley and belt. Downwards movement, however, is accomplished by relying on gravity, i.e. the slow-scan servo motor unwinding the belt from the pulley, thereby allowing the shuttle, fast-scan motor, and arm to move together downwards.

Such a workpiece scanning mechanism has a number of drawbacks. For example, the slow-scan movement can only be in the vertical or near-vertical direction, due to reliance on gravity for at least one direction of the slow-scan movement. Secondly, contamination or failure of the shuttle drive assembly can cause the slow-scan movement to jam at some position of the shuttle along the rail of the shuttle drive assembly, the force of gravity in some cases being unable to pull the shuttle, fast-scan motor, and arm downwards as the process recipe requires, resulting in a workpiece not being processed correctly. Even worse, if gravity at some point does overcome the jammed shuttle, and if a sufficient length of belt has been previously un-wound from the pulley, the entire shuttle, fast-scan motor, and arm carrying the workpiece can suddenly free fall, causing excessive force to be applied to the belt, pulley, and slow-scan servo motor, typically leading to slow-scan servo motor failure.

Another drawback of current workpiece scanning mechanisms arises from the arm being periodically exposed to the GCIB, particularly at times when the lowermost portions of the workpiece are being processed. The GCIB striking the arm assembly can cause sputtering of material of which the arm is comprised, contaminating the process environment with sputtered material and thus decreasing device yield.

The present invention seeks to rectify the aforementioned shortcomings of the gravity-assisted workpiece scanning mechanism. It further seeks to rectify contamination issues associated with the GCIB striking the arm holding the workpiece, during certain phases of workpiece processing.

SUMMARY OF THE INVENTION

One aspect of the invention is an apparatus for scanning a workpiece through a GCIB, comprising an elongated member adapted to mount a workpiece; a rotational mechanism mounting the elongated member at a point of rotation and configured to repetitively scan the workpiece through the GCIB along an arcuate path; a slow-scan mechanism suspending the elongated member and rotational mechanism, and configured to cause linear movement of the rotational mechanism and the elongated member, to cause different portions of the workpiece to pass through the GCIB, the slow-scan mechanism comprising a shuttle drive assembly having a rail and a shuttle, the rotational mechanism being attached to and suspended by the shuttle; a first pulley; a second pulley; a belt mounted over the pulleys and attached to the shuttle; and a drive mechanism to actuate the belt.

Another aspect of the invention is an apparatus in which the drive mechanism comprises a servo motor having a drive shaft; a first sprocket attached to the drive shaft; a vacuum rotary feedthrough; a second sprocket attached to the vacuum rotary feedthrough; and a geared belt mounted over the first and second sprockets.

Another aspect of the invention is a system for processing workpieces using a GCIB, comprising a nozzle to form a gas cluster beam from a gas; a skimmer for removing undesired gas clusters from the gas cluster beam; an ionizer to ionize the gas cluster beam and form a GCIB; an accelerator to accelerate the GCIB; a workpiece scanning mechanism enclosed in a processing chamber and configured to scan the workpiece through the GCIB, the workpiece scanning mechanism comprising an elongated member adapted to mount a workpiece; a rotational mechanism mounting the elongated member at a point of rotation and configured to repetitively scan the workpiece through the GCIB along an arcuate path; a slow-scan mechanism suspending the elongated member and rotational mechanism, and configured to cause linear movement of the rotational mechanism and the elongated member, to cause different portions of the workpiece to pass through the GCIB, the slow-scan mechanism comprising a shuttle drive assembly having a rail and a shuttle, the rotational mechanism being attached to and suspended by the shuttle; a first pulley; a second pulley; a belt mounted over the pulleys and attached to the shuttle; and a drive mechanism to actuate the belt.

Yet another aspect of the invention is a method for scanning a workpiece through an ion beam, comprising the steps of mounting a workpiece within an GCIB path at an end of an elongated member; partially, repetitively rotating the elongated member using a rotational mechanism attached to a point of rotation on the elongated member, to make repetitive scans of the workpiece through the GCIB, along an arcuate path; moving the elongated member and rotational mechanism along a slow-scan mechanism, to which the rotational mechanism is attached and is suspended by, the moving causing different portions of the workpiece to pass through the GCIB path during the repetitive scans, the slow-scan mechanism comprising a shuttle drive assembly having a rail and a shuttle, the rotational mechanism being attached to and suspended by the shuttle; a first pulley; a second pulley; a belt mounted over the pulleys and attached to the shuttle; and a drive mechanism to actuate the belt, wherein the moving includes actuating the drive mechanism and the belt so as to cause linear movement of the shuttle along the rail.

A further aspect of the invention includes a design of the arm which holds and scans the workpiece, wherein the arm comprises at least one opening to allow passage of the GCIB through the arm at times when the GCIB strikes the arm, thereby reducing arm material sputtering. In a further embodiment, shields can be provided to deflect the GCIB from portions of the arm periodically exposed to the GCIB, which shields can be made of a material compatible with the GCIB process, thus reducing process contamination. In yet a further embodiment, a backside shield can also be provided to protect the backside of the workpiece from contamination present in the processing chamber.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 10A-D show a low contamination embodiment of the scanning arm in accordance with an embodiment of the invention.

DETAILED DESCRIPTION OF EXEMPLARY EMBODIMENTS

In the following description, in order to facilitate a thorough understanding of the invention and for purposes of explanation and not limitation, specific details are set forth, such as particular geometries of a lithography, coater/developer, and gap-fill treatment system, and descriptions of various components and processes. However, it should be understood that the invention may be practiced in other embodiments that depart from these specific details.

In the following description, the terms ion beam and gas cluster ion beam (GCIB) will be used interchangeably, as the workpiece scanning mechanism described herein can be used for processing workpieces using ordinary (i.e. monomer) ion beams and gas cluster ion beams (GCIB).

In the following description, the terms workpiece, substrate, and wafer will be used interchangeably, to denote a workpiece being processed by an ion beam or gas cluster ion beam (GCIB). The workpiece can include a conductive, semiconductive, or dielectric substrate, with or without various patterned or unpatterned films formed thereupon. Further, the workpiece can be of any shape, e.g. circular, rectangular, etc., and size, e.g. a circular wafer of 6 inches, 8 inches, 12 inches, or higher diameter. Example workpieces include wafers or semiconductor wafers, flat panel displays (FPD), liquid crystal displays (LCD), etc.

Figure 1:
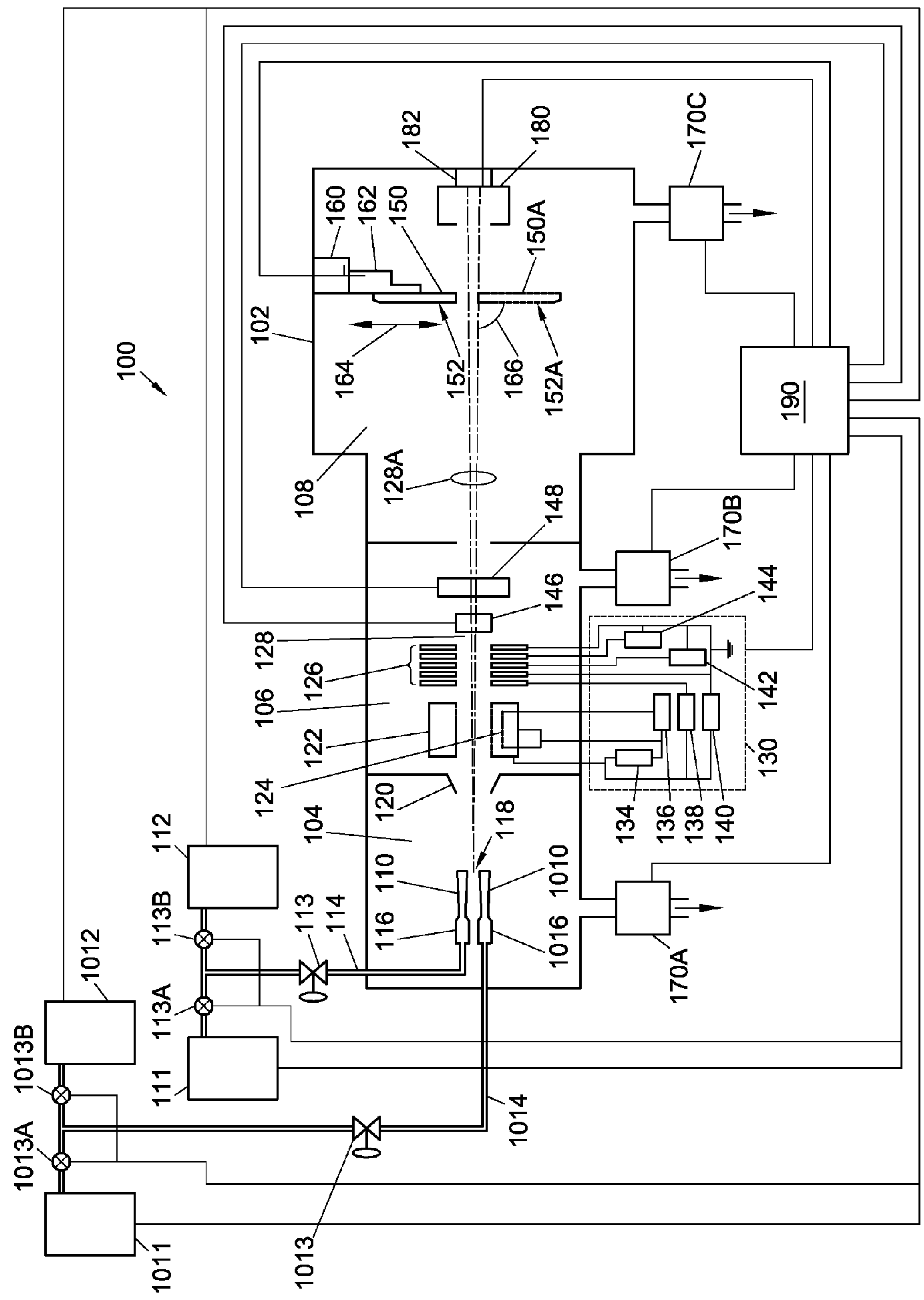
FIG. 1 is a schematic of a multiple nozzle GCIB system in accordance with an embodiment of the invention.

Referring now to FIG. 1, a GCIB processing system 100 for modifying, depositing, growing, or doping a layer is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

In the exemplary embodiment of FIG. 1, GCIB processing system 100 comprises two gas supplies 115, 1015 and two nozzles 116, 1016. Additional embodiments will be discussed later having numbers of nozzles different than two, and numbers of gas supplies different than two, all of which fall within the scope of the invention. Each of the two gas supplies 115 and 1015 is connected to one of two stagnation chambers 116 and 1016, and nozzles 110 and 1010, respectively. The first gas supply 115 comprises a first gas source 111, a second gas source 112, a first gas control valve 113A, a second gas control valve 113B, and a gas metering valve 113. For example, a first gas composition stored in the first gas source 111 is admitted under pressure through a first gas control valve 113A to the gas metering valve or valves 113. Additionally, for example, a second gas composition stored in the second gas source 112 is admitted under pressure through the second gas control valve 113B to the gas metering valve or valves 113. Further, for example, the first gas composition or second gas composition, or both, of first gas supply 115 can include a condensable inert gas, carrier gas or dilution gas. For example, the inert gas, carrier gas or dilution gas can include a noble gas, i.e., He, Ne, Ar, Kr, Xe, or Rn.

Similarly, the second gas supply 1015 comprises a first gas source 1011, a second gas source 1012, a first gas control valve 1013A, a second gas control valve 10138, and a gas metering valve 1013. For example, a first gas composition stored in the first gas source 1011 is admitted under pressure through the first gas control valve 1013A to the gas metering valve or valves 1013. Additionally, for example, a second gas composition stored in the second gas source 1012 is admitted under pressure through the second gas control valve 10138 to the gas metering valve or valves 1013. Further, for example, the first gas composition or second gas composition, or both, of second gas supply 1015 can include a condensable inert gas, carrier gas or dilution gas. For example, the inert gas, carrier gas or dilution gas can include a noble gas, i.e., He, Ne, Ar, Kr, Xe, or Rn.

Furthermore, the first gas sources 111 and 1011, and the second gas sources 112 and 1012 are each utilized to produce ionized clusters. The material compositions of the first and second gas sources 111, 1011, 112, and 1012 include the principal atomic (or molecular) species, i.e., the first and second atomic constituents desired to be introduced for doping, depositing, modifying, or growing a layer.

The high pressure, condensable gas comprising the first gas composition and/or the second gas composition is introduced from the first gas supply 115 through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and a gas cluster beam emanates from nozzle 110.

Similarly, the high pressure, condensable gas comprising the first gas composition and/or the second gas composition is introduced from the second gas supply 1015 through gas feed tube 1014 into stagnation chamber 1016 and is ejected into the substantially lower pressure vacuum through a properly shaped nozzle 1010. As a result of the expansion of the high pressure, condensable gas from the stagnation chamber 1016 to the lower pressure region of the source chamber 104, the gas velocity accelerates to supersonic speeds and a gas cluster beam emanates from nozzle 1010.

Nozzles 110 and 1010 are mounted in such close proximity that the individual gas cluster beams generated by the nozzles 110, 1010 substantially coalesce in the vacuum environment of source chamber 104 into a single gas cluster beam 118 before reaching the gas skimmer 120. The chemical composition of the gas cluster beam 118 represents a mixture of compositions provided by the first and second gas supplies 115 and 1015, injected via nozzles 110 and 1010.

The inherent cooling of the jet as static enthalpy is exchanged for kinetic energy, which results from the expansion in the jets, causes a portion of the gas jets to condense and form a gas cluster beam 118 having clusters, each consisting of from several to several thousand weakly bound atoms or molecules. A gas skimmer 120, positioned downstream from the exit of nozzles 110 and 1010 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The first and second gas supplies 115 and 1015 can be configured to independently control stagnation pressures and temperatures of gas mixtures introduced to stagnation chambers 116 and 1016. Temperature control can be achieved by the use of suitable temperature control systems (e.g. heaters and/or coolers) in each gas supply (not shown). In addition, a manipulator 117 may be mechanically coupled to nozzle 110, for example via the stagnation chamber 116, the manipulator 117 being configured to position the coupled nozzle 110 with respect to the gas skimmer 120, independent of nozzle 1010. Likewise, a manipulator 1017 may be mechanically coupled to nozzle 1010, for example via the stagnation chamber 1016, the manipulator 1017 being configured to position the coupled nozzle 1010 with respect to the gas skimmer 120, independent of nozzle 110. Thus each nozzle in a multi-nozzle assembly may be separately manipulated for proper positioning vis-à-vis the single gas skimmer 120.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter 146 may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
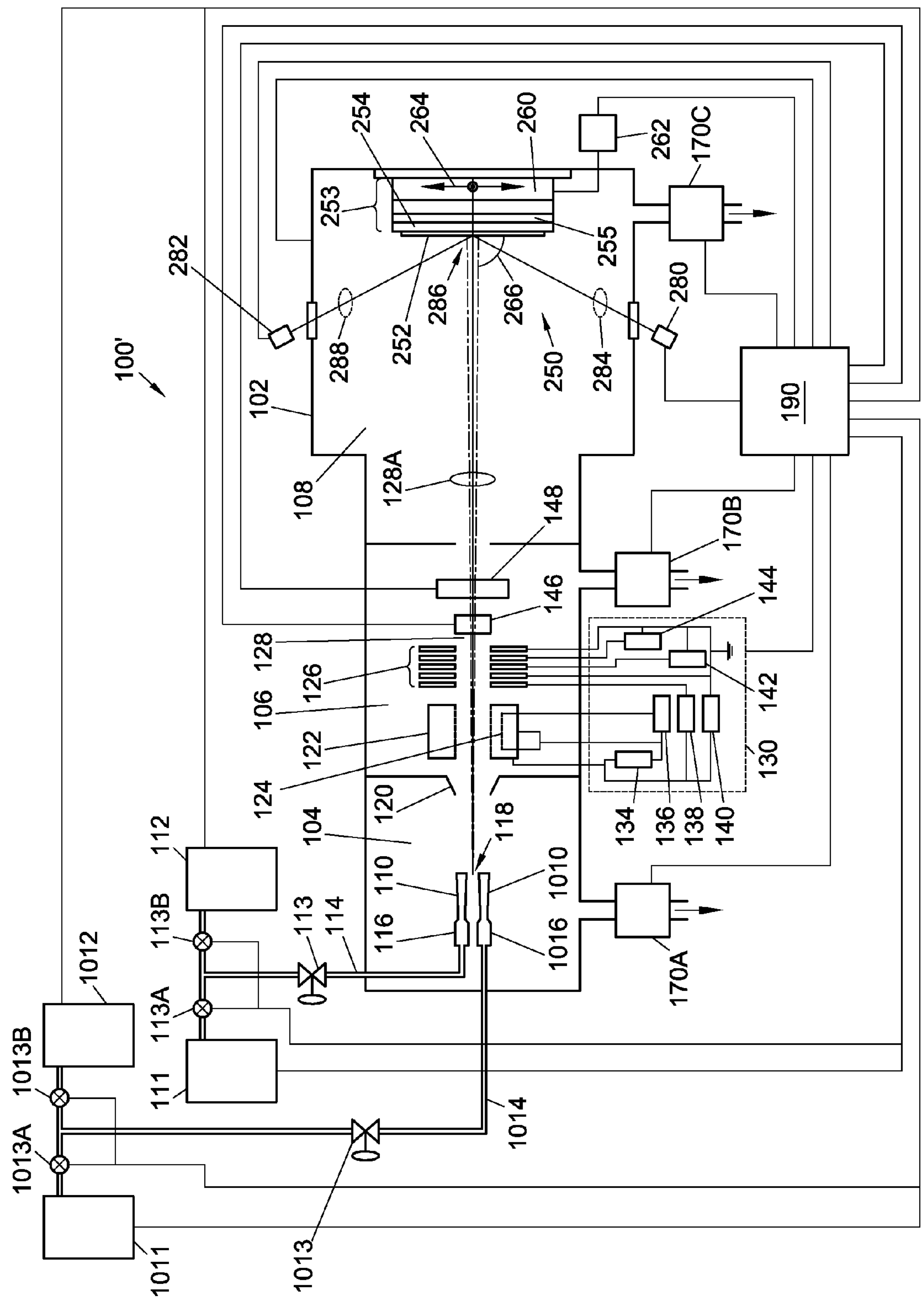
FIG. 2 is a schematic of a multiple nozzle GCIB system in accordance with another embodiment of the invention.

In the embodiment shown in FIG. 2, the GCIB processing system 100' can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 1) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 3:
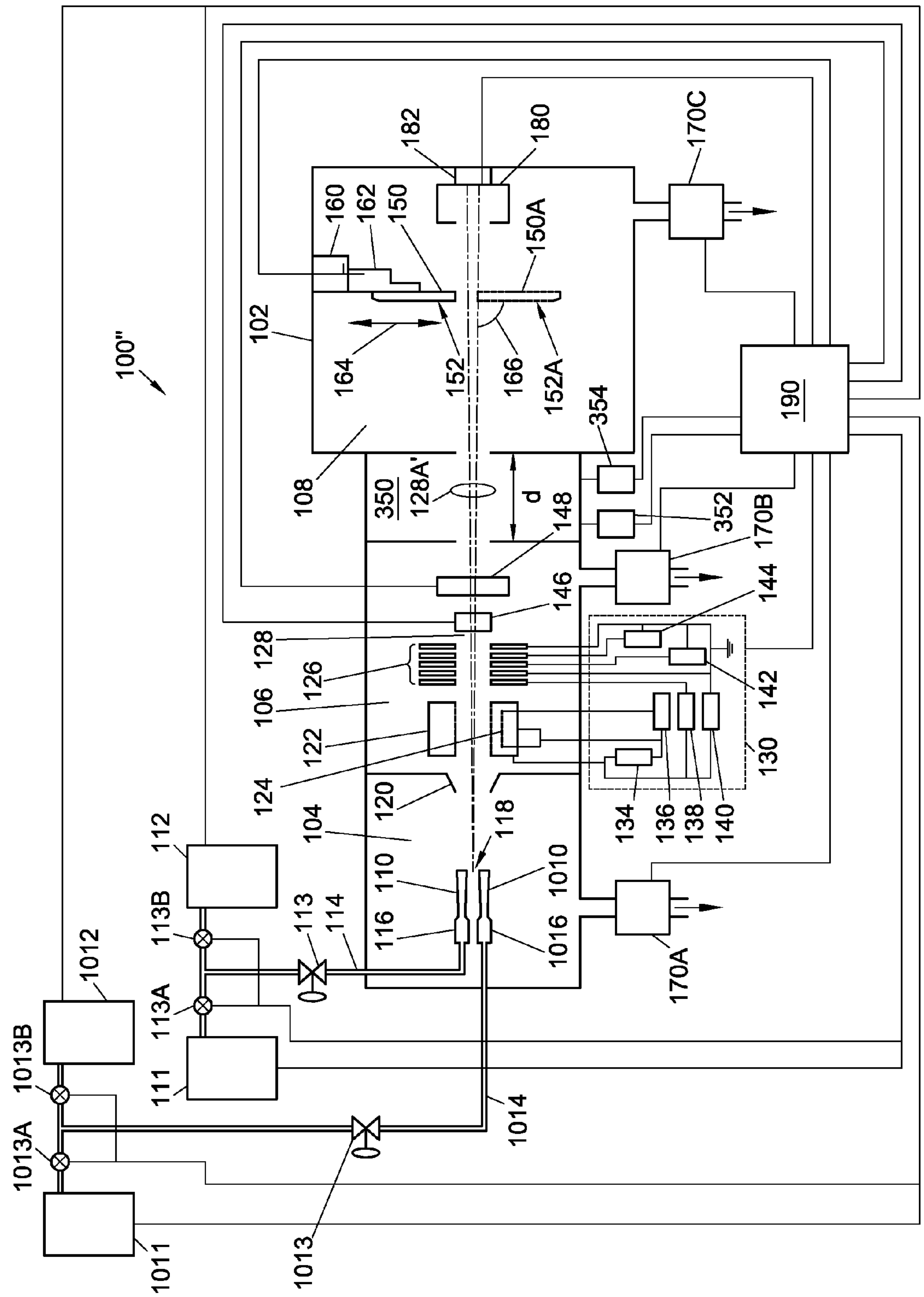
FIG. 3 is a schematic of a multiple nozzle GCIB system in accordance with yet another embodiment of the invention.

In the embodiment shown in FIG. 3, the GCIB processing system 100" can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region.

The extent of modification to the beam energy distribution may be characterized by a pressure-distance integral along at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas sources 111 and 1011, second gas sources 112 and 1012, first gas control valves 113A and 1013A, second gas control valves 113B and 1013B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Also shown in FIGS. 2 and 3 is an alternative embodiment for a nozzle manipulator. Rather than each nozzle 110, 1010 being coupled to a separately operable manipulator 117, 1017 as in FIG. 1, the nozzles 110, 1010 may be coupled to each other, and together coupled to a single manipulator 117A. The position of the nozzles 110, 1010 vis-à-vis the gas skimmer 120 can then be manipulated collectively as a set rather than individually.

Figure 4:
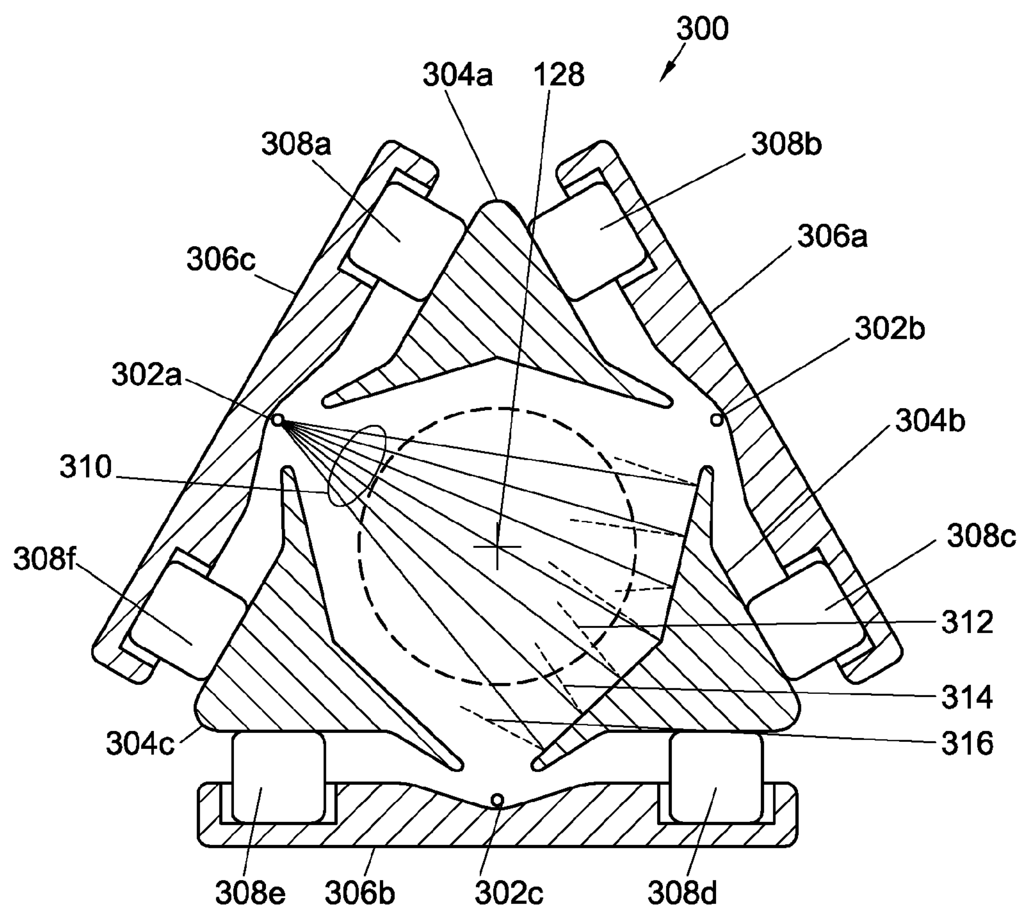
FIG. 4 is a schematic of an embodiment of an ionizer for use in a GCIB system.

Referring now to FIG. 4, a section 300 of a gas cluster ionizer (122, FIGS. 1, 2 and 3) for ionizing a gas cluster jet (gas cluster beam 118, FIGS. 1, 2 and 3) is shown. The section 300 is normal to the axis of GCIB 128. For typical gas cluster sizes (2000 to 15000 atoms), clusters leaving the gas skimmer aperture (120, FIGS. 1, 2 and 3) and entering an ionizer (122, FIGS. 1, 2 and 3) will travel with a kinetic energy of about 130 to 1000 electron volts (eV). At these low energies, any departure from space charge neutrality within the ionizer 122 will result in a rapid dispersion of the jet with a significant loss of beam current. FIG. 4 illustrates a self-neutralizing ionizer. As with other ionizers, gas clusters are ionized by electron impact. In this design, thermo-electrons (seven examples indicated by 310) are emitted from multiple linear thermionic filaments 302*a*, 302*b*, and 302*c* (typically tungsten) and are extracted and focused by the action of suitable electric fields provided by electron-repeller electrodes 306*a*, 306*b*, and 306*c* and beam-forming electrodes 304*a*, 304*b*, and 304*c*. Thermo-electrons 310 pass through the gas cluster jet and the jet axis and then strike the opposite beam-forming electrode 304*b* to produce low energy secondary electrons (312, 314, and 316 indicated for examples).

Though (for simplicity) not shown, linear thermionic filaments 302*b* and 302*c* also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304*a*, 304*b*, and 304*c* are biased positively with respect to linear thermionic filaments 302*a*, 302*b*, and 302*c* and electron-repeller electrodes 306*a*, 306*b*, and 306*c* are negatively biased with respect to linear thermionic filaments 302*a*, 302*b*, and 302*c*. Insulators 308*a*, 308*b*, 308*c*, 308*d*, 308*e*, and 308*f* electrically insulate and support electrodes 304*a*, 304*b*, 304*c*, 306*a*, 306*b*, and 306*c*. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 1, 2 and 3) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figures 5A, 5B:
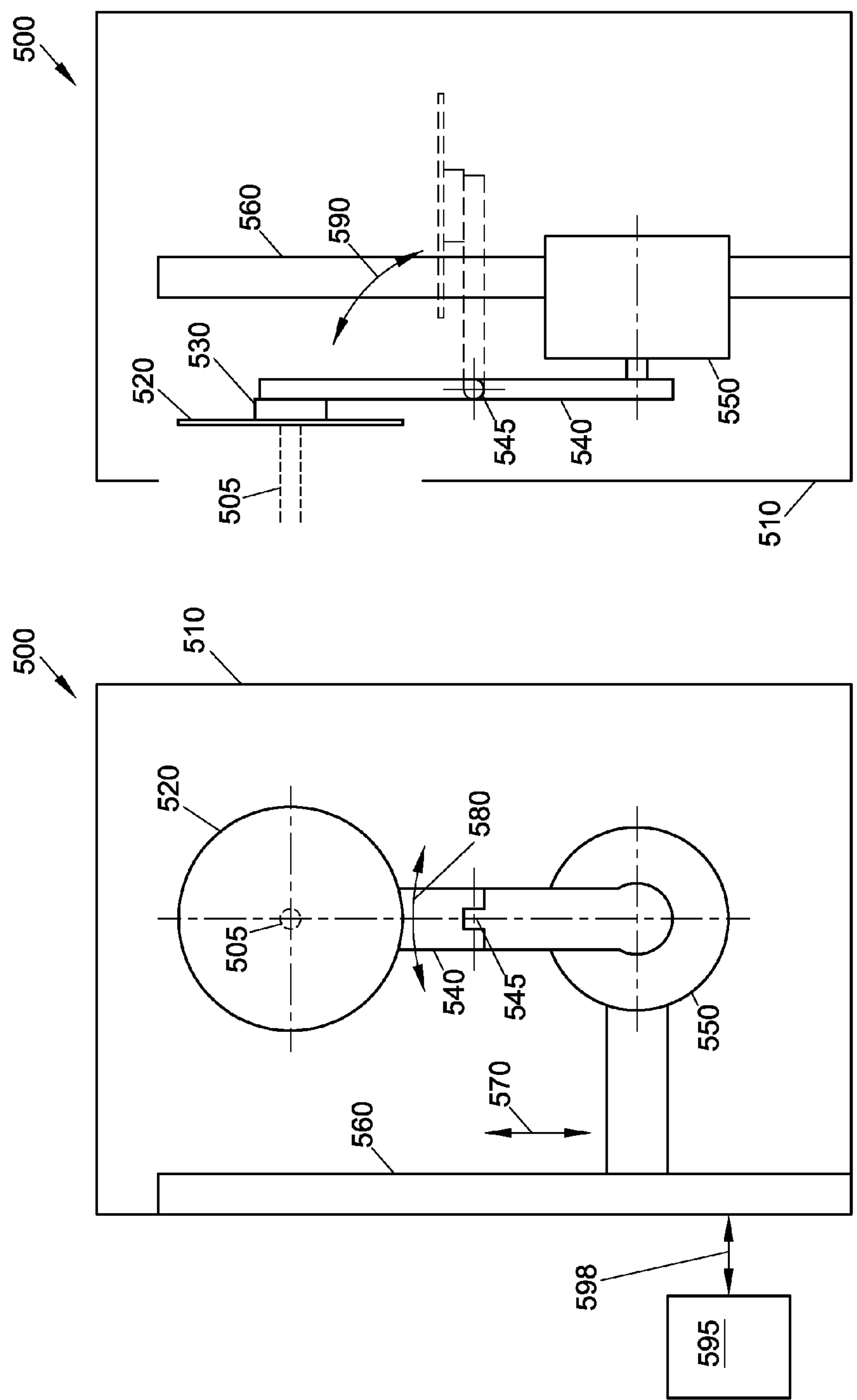
FIGS. 5A and 5B are schematics of an embodiment of a workpiece scanning mechanism for use in a GCIB system.

Referring now to FIGS. 5A and 5B, an embodiment of the workpiece scanning mechanism 500, is shown. The workpiece scanning mechanism 500 is enclosed in a processing chamber 510, which can be, for example, one of processing chambers 108, of processing systems 100, 100', or 100", of FIGS. 1, 2, and 3. The purpose of processing chamber 510 is to enclose the workpiece 520 in a low pressure environment, free of contamination, during irradiation thereof using the GCIB. The workpiece 520 is attached using a chuck 530 to a first end of scanning arm 540, which comprises an elongated member acting to scan the workpiece 520 in a arcuate path 580 across GCIB 505, which enters the processing chamber 510 from, for example, one of ionization/acceleration chambers 106, of processing systems 100, 100', or 100", of FIGS. 1, 2, and 3. Depending on the configuration, the chuck 530 can secure the workpiece 520 to the scanning arm 540 using mechanical clamping, vacuum suction, or using electrostatic clamping. An exemplary embodiment of an electrostatically-clamping chuck 530 is described in U.S. Pat. No. 7,948,734 entitled ELECTROSTATIC CHUCK POWER SUPPLY, and in U.S. patent application Ser. No. 12/749,999 entitled ELECTROSTATIC CHUCK POWER SUPPLY, both incorporated herein by reference in their entirety.

The second end (i.e. point of rotation) of the scanning arm 540, away from workpiece 520 and chuck 530, is attached to the rotary output shaft of the fast-scan motor 550, which acts as a rotational mechanism to actuate the workpiece 520 in the fast-scan movement direction, along arcuate path 580. An exemplary embodiment of a fast-scan motor 550 is described in U.S. Pat. No. 7,608,843 entitled METHOD AND APPARATUS FOR SCANNING A WORKPIECE THROUGH AN ION BEAM, also herein incorporated by reference in its entirety. The fast-scan motor 550 is itself supported by the slow-scan mechanism 560, to be described in greater detail later. The slow-scan mechanism 560 is configured to move the fast-scan motor 550, scanning arm 540, chuck 530, and workpiece 520 in the slow-scan movement direction 570, along a linear path.

While the embodiment of FIGS. 5A and 5B shows the slow-scan mechanism 560 aligned in the vertical direction, and thus the scanning arm 540 acts as an inverted pendulum, the slow-scan mechanism 560 can also be installed in a horizontal direction, or at some angle between horizontal and vertical, while still allowing the GCIB 505 to reach all points of workpiece 520. For example, in one embodiment, the slow-scan mechanism 560 may be mounted horizontally along the bottom wall of processing chamber 510. In another exemplary embodiment, the slow-scan mechanism 560 may be mounted horizontally along the upper wall of processing chamber 510.

To facilitate loading and unloading of workpieces, in one embodiment, the scanning arm 540 may include an optional joint 545, to allow the scanning arm 540 to bend sufficiently backwards, in a bending movement 590, such that the workpiece 520 can be loaded and unloaded from chuck 530 in a horizontal position, as shown in FIG. 5B. Joint 545 can be actuated using a motor (not shown), and an embodiment of a joint actuation system is described in U.S. Pat. No. 7,608,843 entitled METHOD AND APPARATUS FOR SCANNING A WORKPIECE THROUGH AN ION BEAM, herein incorporated by reference in its entirety.

A controller 595, communicating via communication lines 598, is used to control the workpiece scanning mechanism 500. Controller 595 may be implemented as a separate controller, or it can be implemented as a part of control system 190, of processing systems 100, 100', or 100", of FIGS. 1, 2, and 3. Controller 595 comprises a microprocessor, memory, and a digital I/O port capable of generating control voltages sufficient to communicate and activate inputs to workpiece scanning mechanism 500. Moreover, controller 595 can be coupled to and can exchange information with fast-scan motor 550, slow-scan mechanism 560, chuck 530, joint 545, etc. For example, a program stored in the memory can be utilized to activate the inputs to the aforementioned components of the workpiece scanning mechanism 500 according to a process recipe in order to perform a GCIB process on workpiece 520. Controller 595 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

Figure 6:
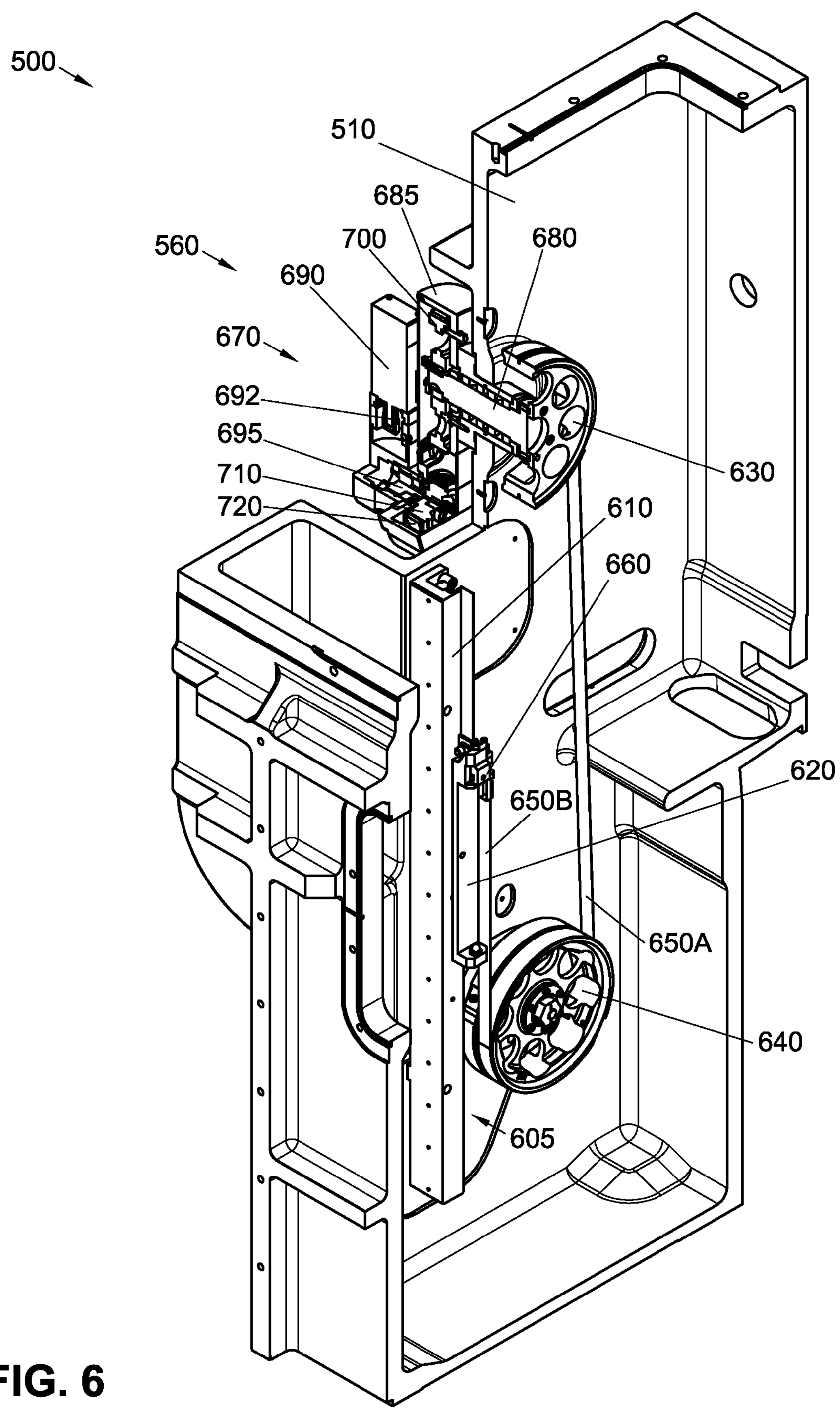
FIG. 6 is a detailed and partial cut-away schematic of a slow-scan mechanism in accordance with an embodiment of the invention.
Figure 7:
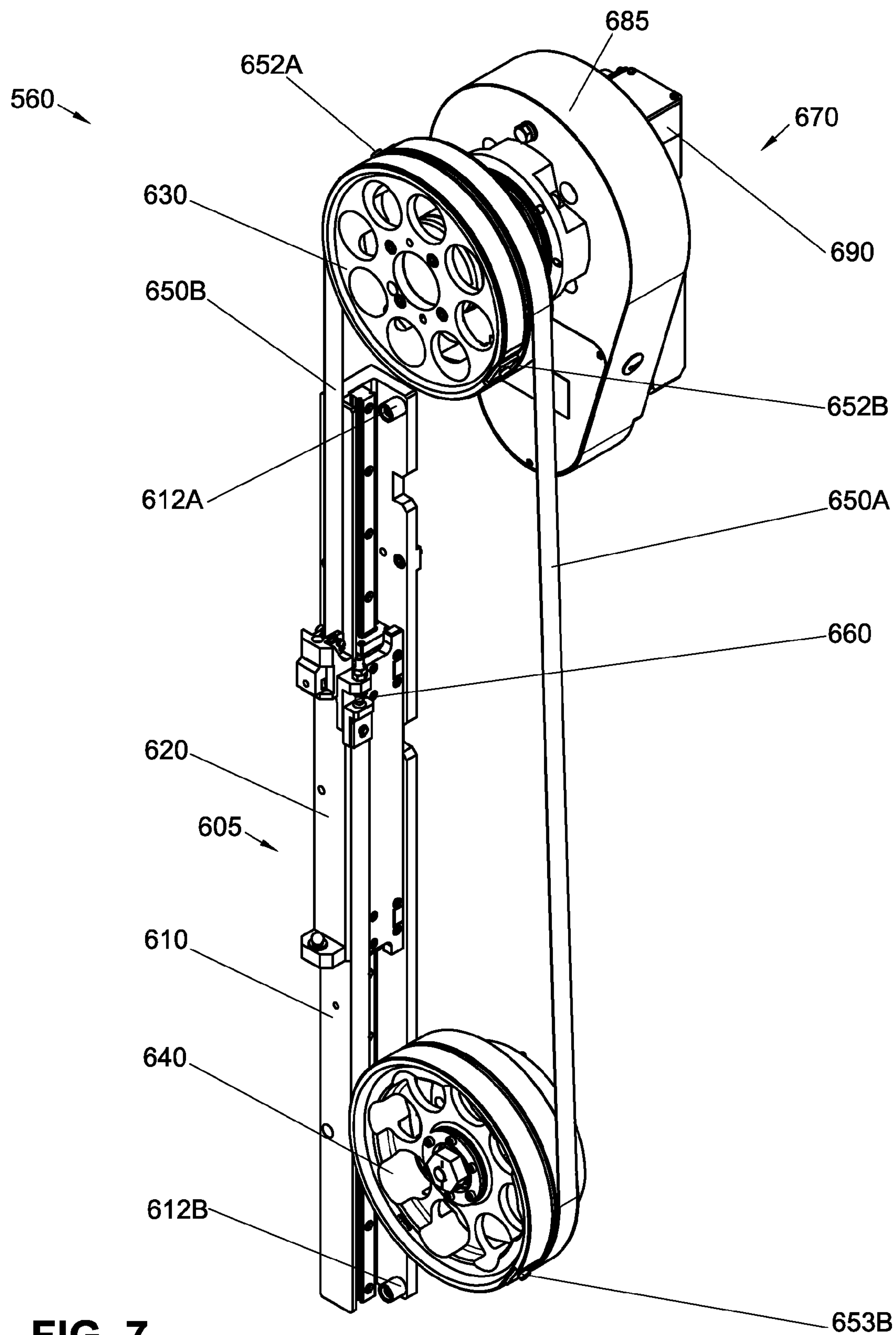
FIG. 7 is a detailed schematic of a slow-scan mechanism in accordance with an embodiment of the invention.

FIGS. 6 and 7 show an exemplary embodiment of slow-scan mechanism 560 of workpiece scanning mechanism 500. The exemplary embodiment of FIGS. 6 and 7 is shown installed such that the slow-scan movement is in the vertical direction, but as was mentioned earlier, other installation angles may be used. FIG. 6 shows partial cutaway views of the assembly, but with the surrounding structure, such as processing chamber 510. FIG. 7 shows a view without the surrounding structures.

At the core of slow-scan mechanism 560 is a shuttle drive assembly 605, comprising a rail 610 and shuttle 620. The shuttle 620 has an attachment point 660, to which the fast-scan motor 550 can be attached, the rail 610 allowing the shuttle 620 (and all structures attached thereto, i.e. fast-scan motor 550, scanning arm 540, chuck 530, and workpiece 520) to freely move along a linear path defining the slow-scan movement direction 570. At the ends of rail 610, stops 612A and 612B are attached to prevent the shuttle 620 from slipping off the rail 610.

Generally parallel to the shuttle drive assembly are installed pulleys 630 and 640, over which belt 650A,B is mounted. The belt 650A,B comprises a full loop, and can be a flat belt or a geared belt. The belt 650A,B is made of a material compatible with the GCIB process, so as to reduce outgassing and contamination, and can be made of a metal or polymeric material. In one embodiment, the belt 650A,B can be made of a single strand or loop of material (not shown). In another embodiment, the belt 650A,B can be made of two portions 650A and 650B, each independently attached to pulleys 630 and 640 respectively, at attachment points 652A, 652B, 653B, etc. In this latter embodiment, each pulley 630 and 640 comprises two side-by-side pulleys, attached together or integrally-machined. Also, in this latter embodiment, the diameters of the pulleys 630 and 640 are chosen large such that the angular travel of pulleys 630 and 640 allows the full range of slow-scan motion of shuttle 620, without the belt portions 650A and 650B separating from their respective attachment points 652A, 652B, 653B, etc.

One portion of belt 650A,B, 650B, is attached to the shuttle 620, proximate the attachment point 660, to facilitate actuation of the shuttle 620 in the slow-scan movement direction 570. In an embodiment, belt 650A,B can be a geared belt, in which case sprockets 630 and 640 are used in lieu of pulleys 630 and 640.

Figure 8:
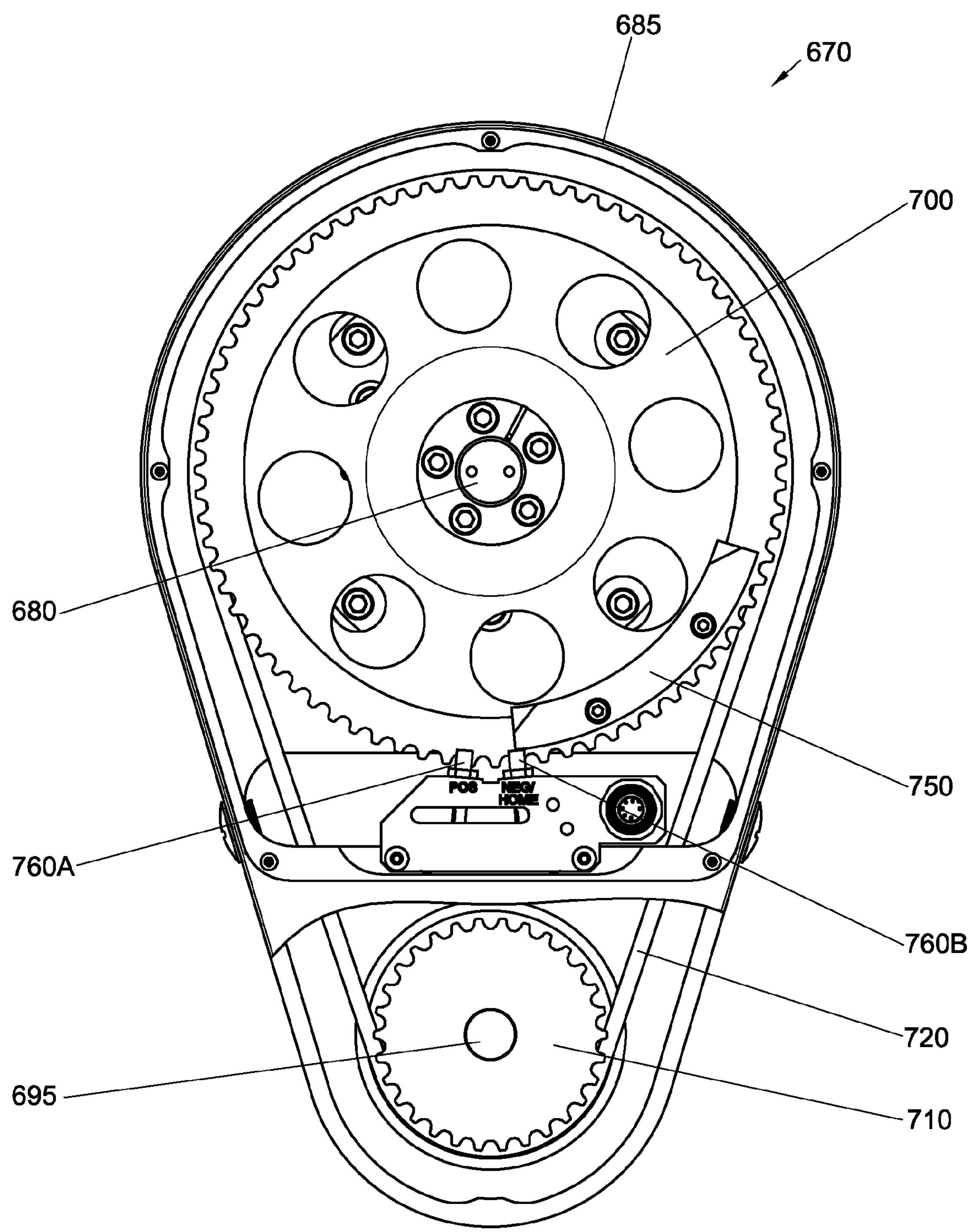
FIG. 8 is a detailed schematic of a portion of a drive mechanism for a slow-scan mechanism in accordance with an embodiment of the invention.

Still with reference to FIGS. 5A, 5B, 6, and 7, to actuate the belt 650A,B and thus effect a slow-scan movement of fast-scan motor 550, scanning arm 540, chuck 530, and workpiece 520, a drive mechanism 670 is provided. Drive mechanism 670 can be attached to any of pulleys 630, 640; and FIGS. 7 and 8 depict it attached to pulley 630 mounted in the upper position along shuttle drive assembly 605. The drive mechanism 670 comprises a vacuum rotary feedthrough 680, mounted on the wall of processing chamber 510, to which vacuum rotary feedthrough the pulley 630 is attached. The vacuum rotary feedthrough 680 allows rotating motion to be imparted on pulley 630, from a servo motor 690 external to the processing chamber 510, without breaching the vacuum maintained within processing chamber 510. Between the vacuum rotary feedthrough 680 and servo motor 690, an optional reducing transmission 685 may be installed. In one embodiment, reducing transmission 685 may comprise a pair of sprockets 700 and 710, over which a geared belt 720 is mounted. Alternatively, the reducing transmission 685 may comprise a pair of pulleys 700 and 710 over which a flat belt 720 is mounted. In yet another alternative embodiment, the reducing transmission 685 may comprise a reduction gear set, for example, instead of a belt drive. The purpose of the reducing transmission 685 is to at least in part reduce the rpms of the servo motor 690 to a level required for safe operation of slow-scan mechanism 560. Additional reduction of rpms of servo motor 690 can be achieved using an optional reduction gear set 692, which may or may not be a part of servo motor 690 itself.

To operate the slow-scan mechanism 560 of the workpiece scanning mechanism 500, servo motor 690 is actuated based on control signals from controller 595. In an embodiment, rotary motion from the servo motor 690 is transmitted via sprockets 700 and 710, and geared belt 720, to the vacuum rotary feedthrough 680. The vacuum rotary feedthrough provides the rotary motion to pulley 630, which actuates the belt 650A,B to initiate movement of shuttle 620, attached thereto. Lastly, pulled by belt 650A,B, the shuttle 620 slides along the linear path defined by rail 610 of shuttle drive assembly 605, guiding the fast-scan motor 550, scanning arm 540, chuck 530, and workpiece 520, attached thereto.

FIG. 8 shows an exemplary embodiment of reducing transmission 685, utilizing a pair of sprockets 700 and 710, and a geared belt 720. The larger sprocket 700 is attached to one end of vacuum rotary feedthrough 680. The smaller sprocket 710 is attached to the drive shaft of servo motor 695. It has been mentioned before that the rotary range of motion of sprocket 700, vacuum rotary feedthrough 680, and pulley 630, needs to be limited to prevent overtravel of belt 650A,B, which may cause separation of portions 650A and 650B of belt 650A,B, from pulleys 630 and 640. To prevent this, a set of limit switches 760A and 760B is installed in the reducing transmission 685, which feed signals to controller 595, to cut out power to servo motor 690 when at the extreme ends of the allowed rotary range of travel of sprocket 700, vacuum rotary feedthrough 680, and pulley 630. A suitably-sized limit switch strike 750 is used to trigger the state of limit switches 760A and 760B at the extreme ends of the allowed rotary range of travel of sprocket 700, vacuum rotary feedthrough 680, and pulley 630.

Advantages of the design of reducing transmission 685, over, for example, a worm gear set described in U.S. Pat. No. 7,608,843 entitled METHOD AND APPARATUS FOR SCANNING A WORKPIECE THROUGH AN ION BEAM (herein incorporated by reference in its entirety), include simplicity, lower cost, and higher resilience to shock arising from varying friction of the shuttle 620 along rail 610, of shuttle drive assembly 605. Along with the use of two pulleys 630 and 640, and a belt 650A,B mounted thereon, the present invention mitigates many of the failure modes of the workpiece scanning mechanism described in U.S. Pat. No. 7,608,843, and discussed before. To replace the natural action of a worm gear pair as a "brake", i.e. in which a sudden increase in the torque load is prevented from being transmitted to a servo motor driving the worm gear, in an embodiment, the servo motor 690 of the present invention can be equipped with a brake.

Figures 9A, 9B:
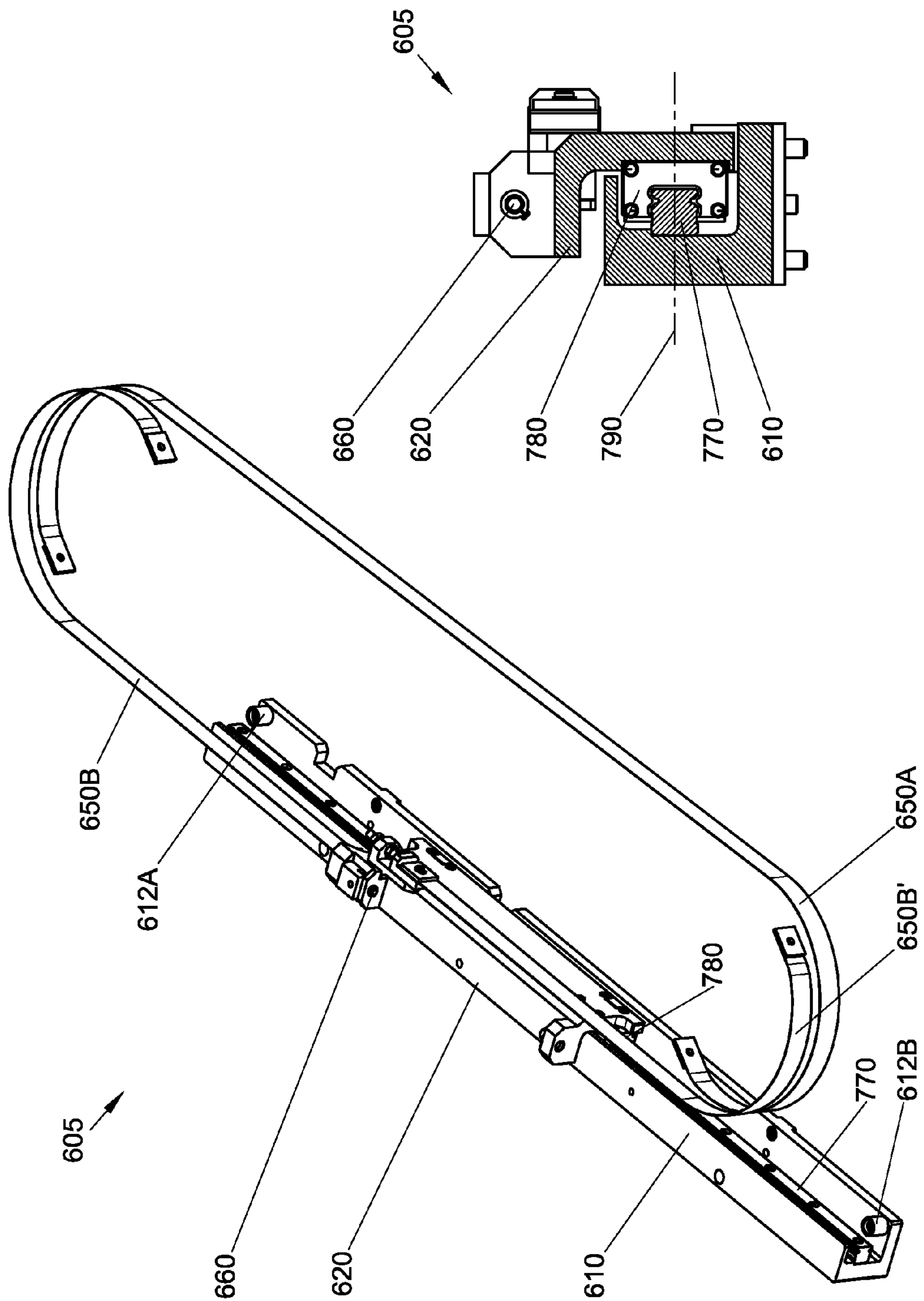
FIGS. 9A and 9B are detailed schematics of a shuttle drive assembly in accordance with an embodiment of the invention.

FIGS. 9A and 9B show an embodiment of a shuttle drive assembly 605. Referring to FIG. 9B, the shuttle drive assembly 605 comprises a rail 610, the rail 610 including a guide 770 installed thereupon. A slider 780 is allowed to slide along guide 770, to which are attached the shuttle 620 and attachment point 660 for attachment of fast-scan motor 550. The guide 770 and slider 780 define a longitudinal plane of symmetry 790 of the shuttle drive assembly 605, and in the present embodiment the shuttle 620 and attachment point 660 are all located outside of the longitudinal plane of symmetry 790. This asymmetric configuration has a number of advantages over prior art symmetrical shuttle drive assemblies, including being less prone to failure due to contamination from a GCIB, because as can be seen in FIGS. 5A, 5B, and 6, for example, the shuttle drive assembly 605 of FIGS. 9A and 9B can be installed such that the opening exposing the guide 770 and slider 780 is oriented away from the direction in which the GCIB 505 enters processing chamber 510, thereby reducing failure rate due to contamination and jamming.

Figure 10A:
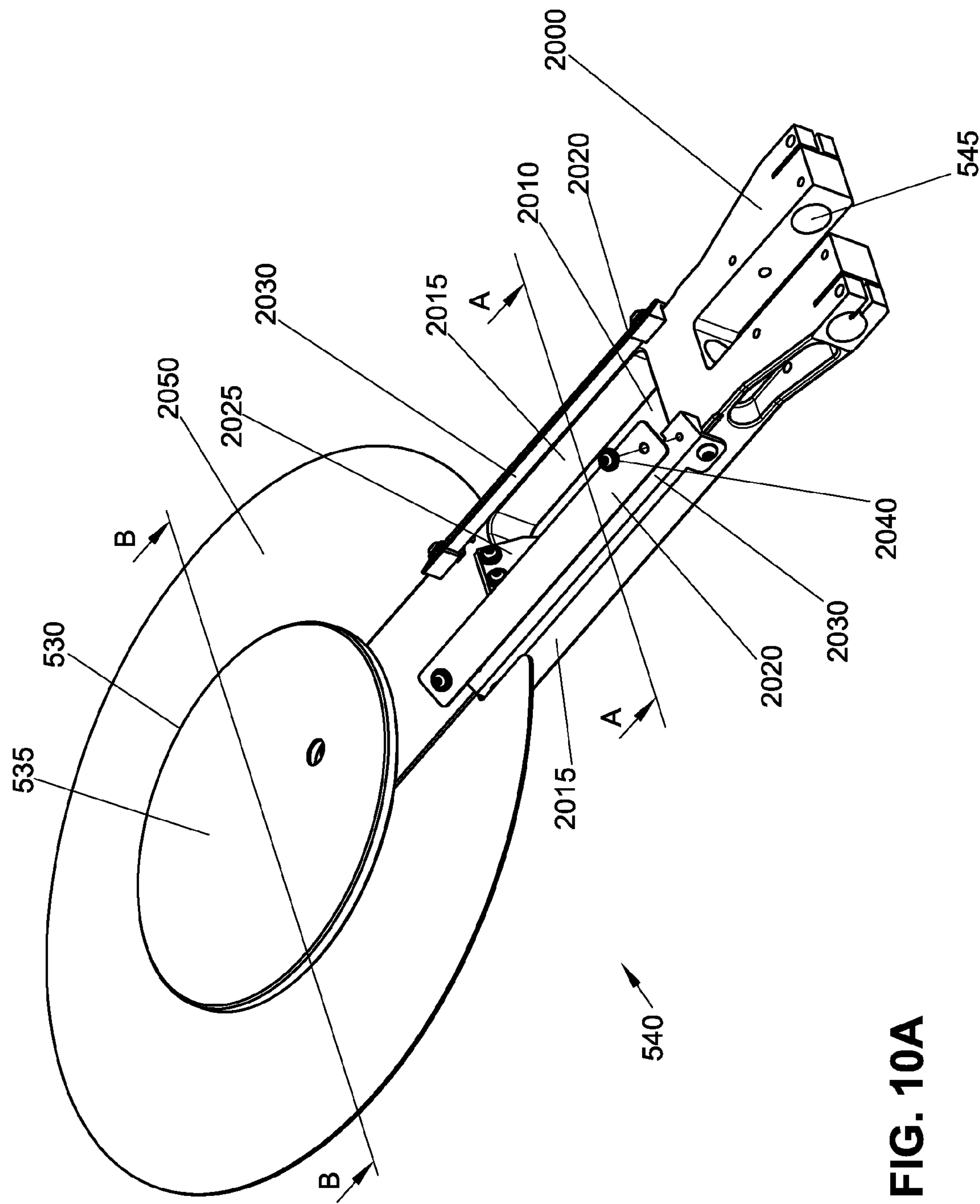

FIG. 10A shows an embodiment of a portion the scanning arm 540, of FIGS. 5A and 5B. The upper scanning arm 2000 of FIG. 10A is the upper portion of scanning arm 540 of FIGS. 5A and 5B, located above the joint 545. At certain times during substrate processing, for example, when the lowermost portions of the workpiece 520 are processed, a portion of, or the entire GCIB 505 can strike the upper scanning arm 2000. The GCIB 505 striking the upper scanning arm 2000 can cause sputtering of material of which the upper scanning arm 2000 is comprised, leading to process contamination, which can lead to lower device yield. This is particularly the case when the material of which the scanning arm is comprised is not compatible with the processes and devices being processed in processing systems 100, 100', or 100".

In an embodiment of the invention, an opening 2010 is formed in the upper scanning arm 2000, which allows the GCIB to pass through the upper scanning arm 2000 when the upper scanning arm 2000 is in a substantially vertical position during fast scans along arcuate path 580. Two portions 2015 of upper scanning arm 2000 surround the opening 2010 and provide structural integrity to the upper scanning arm 2000. In an embodiment, more than one opening 2010 can be formed in the upper scanning arm 2000 (not shown), which openings 2010 can be arrayed along the length and width of upper scanning arm 2000. Openings can be of any suitable shape and size, with the drawings showing an embodiment with a rectangular opening 2010, with rounded corners.

Depending on the width of opening 2010 and the width of upper scanning arm 2000, a substantial amount of GCIB scattering and upper scanning arm material sputtering is eliminated by allowing the GCIB 505 to pass through the upper scanning arm 2000, as depicted in FIGS. 10B and 100, which show alternative Sections A-A of FIG. 10A. However, not all sputtering is eliminated because of existence of portions 2015 which still pass through the GCIB 505 during fast scans along arcuate path 580. To further minimize sputtering of material of upper scanning arm 2000, shields 2020 installed on portions 2015 can be used to deflect the GCIB 505. In an embodiment shown in FIGS. 10A and 10B, shields 2020 comprise plates made of suitable materials compatible with the GCIB process, which plates are mounted at an angle of about 30 to 60 degrees to the incoming GCIB 505, to deflect the scattered portion of GCIB 505 and any sputtered material sideways and away from the processing area. More preferably, the shields can be installed at an angle of about 45 degrees to the incoming GCIB 505. In an alternative embodiment of FIG. 10C, the shields 2020 can be wedge-shaped with the wedge pointing towards the incoming GCIB 505. Shields 2020 can be mounted onto portions 2015 of upper scanning arm 2000 via holders 2030, and the entire assembly can be held together using suitable fasteners 2040, such as screws.

The material of shields 2020 can be selected so as to minimize sputtering from being struck by GCIB 505. Furthermore, materials compatible with the process being performed in processing systems 100, 100', 100" can be selected, such as silicon or silicon-coated metals. In addition to the above, for certain processes, process-compatible ceramics may be used as well, such as alumina or yttria, in both bulk and coated form.

To further reduce GCIB scattering and scanning arm material sputtering, additional shields 2025 can be used to minimize or completely eliminate surfaces of upper scanning arm 2000 directly exposed to GCIB 505. FIG. 10A shows additional shield 2025 protecting the shorter side of opening 2010, but such smaller additional shields can be installed in other locations, too.

In yet another embodiment, to reduce or prevent contamination of the backside of workpiece 520 from sputtered and scattered material in processing chamber 108, an additional workpiece backside shield 2050 can be used. Workpiece backside shield 2050 can preferably be made of size and shape substantially the same as the workpiece itself, and it is mounted to upper scanning arm 2000 in surrounding relationship with the chuck 530 and parallel to and forming a narrow gap with the backside of workpiece 520, when it rests on chuck surface 535, as shown in FIG. 10A and FIG. 10D which represents Section B-B of FIG. 10A. Materials of which workpiece backside shield 2050 can be made include silicon, or silicon-coated metals, such as silicon-coated aluminum, but can also include nickel-plated metals, such as nickel-plated aluminum. Because the workpiece backside shield 2050 is not directly exposed to the GCIB 505, the selection of material is less critical than the selection of material of which shields 2020 are made. Both shields 2020 and 2050 can be made easily replaceable, so they can be replaced when eroded due to sputtering (in the case of shields 2020) or when too much contamination gets coated on them.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. An apparatus for scanning a workpiece through an ion beam, comprising:

an elongated member having a workpiece chuck at a first end, for mounting a workpiece to be processed;

a rotational mechanism mounting the elongated member at a point of rotation located on the elongated member away from the first end, and adapted to repetitively scan the workpiece through the ion beam along an arcuate path;

a slow-scan mechanism suspending the elongated member and rotational mechanism, and adapted to cause movement of the rotational mechanism and the elongated member, to cause different portions of the workpiece to pass through the ion beam, wherein the elongated member comprises at least one opening located between the first end and the point of rotation, and facing the incoming ion beam, the at least one opening allowing passage of the ion beam through the elongated member.

2. The apparatus of claim 1, wherein the elongated member comprises a single opening.

3. The apparatus of claim 1, wherein the elongated member further comprises:

at least one shield adjacent the at least one opening in the elongated member, to protect a portion of the elongated member from the incoming ion beam.

4. The apparatus of claim 3, wherein the at least one shield comprises:

a shield plate facing the incoming ion beam,

5. The apparatus of claim 4, wherein the shield plate is oriented at an angle different than 90 degrees to the incoming ion beam.

6. The apparatus of claim 4, wherein the shield plate is oriented at an angle between 30 and 60 degrees to the incoming ion beam.

7. The apparatus of claim 4, wherein the shield plate is replaceable.

8. The apparatus of claim 4, wherein the shield plate comprises a flat piece of sheet metal.

9. The apparatus of claim 4, wherein the shield plate comprises silicon.

10. The apparatus of claim 4, wherein the shield place comprises silicon-coated metal.

11. The apparatus of claim 4, wherein the at least one shield further comprises:

a holder for attaching the shield plate to the elongated member.

12. The apparatus of claim 3, wherein the at least one shield is wedge-shaped, the wedge of the at least one shield being oriented towards the incoming ion beam.

13. The apparatus of claim 1, further comprising:

a workpiece backside shield mounted in surrounding relationship with the workpiece chuck.

14. The apparatus of claim 13, wherein the workpiece backside shield is of substantially the same shape and size as the workpiece.

15. The apparatus of claim 13, wherein the workpiece backside shield comprises a flat piece of sheet metal.

16. The apparatus of claim 13, wherein the workpiece backside shield is replaceable.

17. The apparatus of claim 13, wherein the workpiece backside shield comprises aluminum, anodized aluminum, or nickel-plated aluminum.

18. The apparatus of claim 1, wherein the ion beam is a gas cluster ion beam (GCIB).

* * * * *

UNITED STATES PATENT AND TRADEMARK OFFICE

CERTIFICATE OF CORRECTION

PATENT NO. : 9,029,808 B2
APPLICATION NO. : 14/444791
DATED : May 12, 2015
INVENTOR(S) : Matthew C. Gwinn et al.

It is certified that error appears in the above-identified patent and that said Letters Patent is hereby corrected as shown below:

In the Specification:

In Col. 3, line 27, "within an GCIB path" should read --within a GCIB path--.

In Col. 8, line 36, "over-scan is performed" should read --over-scan are performed--.

In Col. 8, line 44, "faraday cup" should read --Faraday cup--.

In Col. 16, line 52, "of a portion the scanning" should read --of a portion of the scanning--.

In Col. 18, line 9, "but do not denote" should read --but does not denote--.

In the Claims:

In Col. 18, line 64, Claim 4, "the incoming ion beam," should read --the incoming ion beam.--.

In Col. 19, line 10, Claim 10, "wherein the shield place" should read --wherein the shield plate--.

Signed and Sealed this
Sixth Day of October, 2015

Michelle K. Lee
*Director of the United States Patent and Trademark Office*